United States Patent
Kobayashi

(10) Patent No.: US 7,868,528 B2
(45) Date of Patent: Jan. 11, 2011

(54) LIGHT EMITTING DEVICE WITH TRANSLUCENT SEMI-REFLECTION LAYER AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 12/212,175

(22) Filed: Sep. 17, 2008

(65) Prior Publication Data

US 2009/0103304 A1 Apr. 23, 2009

(30) Foreign Application Priority Data

Oct. 18, 2007 (JP) .............................. 2007-270990
Aug. 29, 2008 (JP) .............................. 2008-221045

(51) Int. Cl.
*H01J 5/16* (2006.01)
*H01J 61/40* (2006.01)
*H01K 1/26* (2006.01)
*H01K 1/30* (2006.01)

(52) U.S. Cl. ....................... 313/112; 313/498; 313/503; 313/506; 313/512

(58) Field of Classification Search ......... 313/498–512, 313/112, 113
See application file for complete search history.

(56) References Cited

U.S. PATENT DOCUMENTS

| | | | |
|---|---|---|---|
| 7,218,049 | B2 | 5/2007 | Yamada et al. |
| 2006/0214573 | A1* | 9/2006 | Maeda et al. ............... 313/506 |
| 2007/0015429 | A1* | 1/2007 | Maeda et al. ................. 445/24 |
| 2008/0157657 | A1* | 7/2008 | Matsunami et al. ......... 313/504 |
| 2008/0224594 | A1* | 9/2008 | Takagi et al. ................ 313/498 |
| 2009/0079335 | A1* | 3/2009 | Mitsuya et al. ............. 313/504 |
| 2009/0091238 | A1* | 4/2009 | Cok et al. ................... 313/498 |
| 2009/0212694 | A1* | 8/2009 | Cok .......................... 313/506 |
| 2009/0278454 | A1* | 11/2009 | Fedorovskaya et al. ..... 313/512 |

FOREIGN PATENT DOCUMENTS

| | | |
|---|---|---|
| JP | A-2004-164890 | 6/2004 |
| JP | B2-3944906 | 7/2007 |
| WO | WO 01/30554 A1 | 5/2001 |

* cited by examiner

*Primary Examiner*—Karabi Guharay
*Assistant Examiner*—Kevin Quarterman
(74) *Attorney, Agent, or Firm*—Oliff & Berridge, PLC

(57) ABSTRACT

A light emitting device includes: a light emitting element which includes a first electrode layer, a second electrode layer, and a light emitting function layer disposed between the first electrode and the second electrode; a reflection layer which reflects light emitted from the light emitting function layer toward the light emitting function layer; and a translucent semi-reflection layer which is disposed opposite the reflection layer with the light emitting function layer interposed therebetween to reflect some of the light emitted from the light emitting function layer toward the light emitting function layer and to transmit the remainder of the light, wherein the translucent semi-reflection layer has a refractive index of 1 or more.

6 Claims, 11 Drawing Sheets

FIG. 3
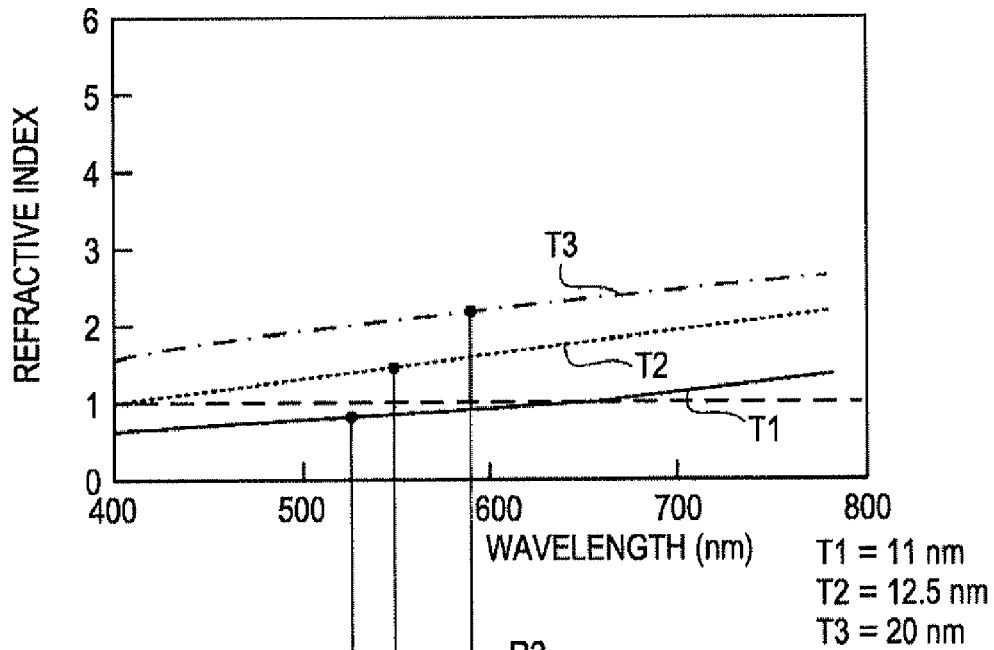
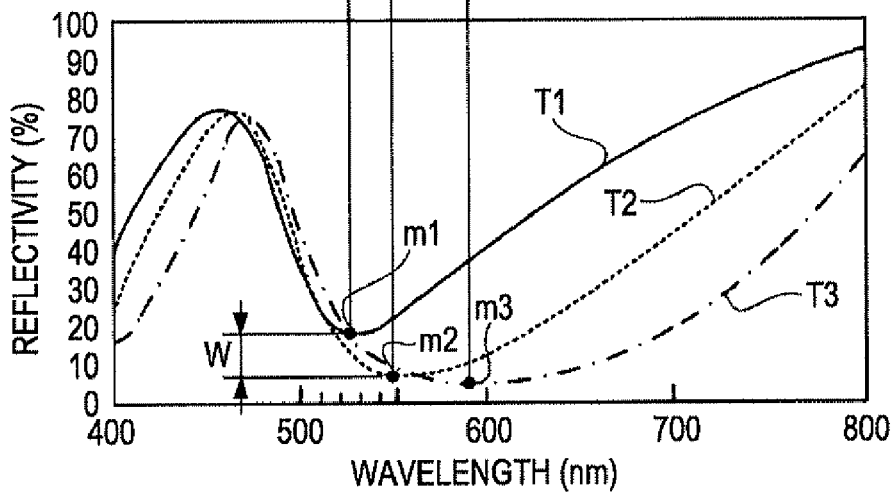

FIG. 4

| | LIGHT EMITTING ELEMENT 2R | LIGHT EMITTING ELEMENT 2G | LIGHT EMITTING ELEMENT 2B |
|---|---|---|---|
| WAVELENGTH $\lambda$ OF ATTENUATION TARGET | $\lambda_R = 610$ | $\lambda_G = 550$ | $\lambda_B = 470$ |
| PHASE VARIATION $\phi_1$ | $\phi_{1R} = 2.33$ | $\phi_{1G} = 2.2$ | $\phi_{1B} = 2.12$ |
| PHASE VARIATION $\phi_2$ | $\phi_{2R} = 2.51$ | $\phi_{2G} = 2.41$ | $\phi_{2B} = 2.33$ |

FIG. 5

| | MATERIAL | PHYSICAL THICKNESS (nm) | | |
|---|---|---|---|---|
| | | LIGHT EMITTING ELEMENT 2R | LIGHT EMITTING ELEMENT 2G | LIGHT EMITTING ELEMENT 2B |
| INSULATING TRANSPARENT LAYER 14 | SiN | 90 | 90 | 90 |
| FIRST ELECTRODE LAYER 18 | ITO | 86.4 | 43.2 | 27 |
| LIGHT EMITTING FUNCTION LAYER 20 | ORGANIC LIGHT EMITTING MATERIAL | 94 | 94 | 94 |

| | | REFRACTIVE INDEX (nm) | | |
|---|---|---|---|---|
| | | WITH WAVELENGTH $\lambda_R$ | WITH WAVELENGTH $\lambda_G$ | WITH WAVELENGTH $\lambda_B$ |
| INSULATING TRANSPARENT LAYER 14 | | 1.87 | 1.88 | 1.89 |
| FIRST ELECTRODE LAYER 18 | | 1.89 | 1.97 | 2.03 |
| LIGHT EMITTING FUNCTION LAYER 20 | | 1.8 | 1.83 | 1.86 |

REFLECTIVITY OF EXTERNAL LIGHT
(BLUE LIGHT)

T1 = 11 nm
T2 = 12.5 nm
T3 = 20 nm

REFLECTIVITY OF EXTERNAL LIGHT
(RED LIGHT)

T1 = 11 nm
T2 = 12.5 nm
T3 = 20 nm

REFLECTIVITY OF EXTERNAL LIGHT (R, G, B)

VISIBILITY PROPERTY

REFLECTIVITY OF EXTERNAL LIGHT
(GREEN LIGHT)

C0 = Mg SINGLE MATERIAL
C1 = MgAg10:1
C3 = MgAg10:5
C4 = MgAg10:10

REFLECTIVITY OF EXTERNAL LIGHT
(R, G, B)

VISIBILITY PROPERTY

LIGHT EMITTING DEVICE WITH TRANSLUCENT SEMI-REFLECTION LAYER AND ELECTRONIC APPARATUS

BACKGROUND

1. Technical Field

The present invention relates to a light emitting device which emits light by electroluminescence and an electronic apparatus.

2. Related Art

As a thin lightweight light emitting source, an OLED (Organic Light Emitting Diode), that is, an organic EL (Electro Luminescent) element is popular. Accordingly, an image display device having a plurality of the organic EL elements has been developed. The organic EL element has a structure in which at least one organic thin film layer made of an organic material is interposed between pixel electrodes and counter electrodes.

In a field of the organic EL element, there is a known technique (for example, a PCT pamphlet No. WO01/39554) for intensifying light having a specific wavelength in emitted light, using amplified interference, that is, resonance. This technique is capable of improving color purity of luminescent color or improving efficiency of light radiated in response to light emission.

However, the organic EL element has a problem with deterioration of a display image quality caused due to external light reflecting from a display surface. In order to solve this problem, a method of disposing a circular polarizing plate on a display surface side has been suggested, for example. However, since the circular polarizing plate attenuates light generated in a light emitting layer to a half or less, a problem may also occur in that brightness deteriorates.

There has also been suggested a method of reducing reflection of external light by overlapping a color filter with the organic EL element. In this method, the color filter absorbs light having a wavelength other than a wavelength to be transmitted. However, such a method of just using the color filter can reduce the reflection of light having colors different from colors of light emitted by the organic EL element, but cannot reduce the reflection of light having colors similar to colors of light emitted from the organic EL element that much.

Japanese Patent No. 3944906 discloses a technique for adjusting a phase of reflected light of external light in semi-transmissive reflective electrodes of an organic light emitting element and a phase of the reflected light of the external light in reflective electrodes so as to be reversed from each other.

However, Japanese Patent No. 3944906 has a problem in that the reflected light may be reduced due to attenuated interference when the phase of the reflected light in one layer and the phase of the reflected light in another layer are reversed from each other. Moreover, there is a limit to an increase in efficiency of the light emitted from the organic light emitting element under such a condition. In Japanese Patent No. 3944906, the organic light emitting element includes the semi-transmissive reflective electrodes and the reflective electrodes, and has a resonant structure for resonating light by reciprocating the light between such electrodes. However, even in the structure in which light reciprocates between the electrodes, the light is not resonated, and thus use efficiency of light may not be improved if an optical factor such as an optical distance is not appropriate.

SUMMARY

An advantage of some aspects of the invention is that it provides a light emitting device and an electronic apparatus including the light emitting device which can be realized in an embodiment or an applied example described below to solve at least some of the above-described problems.

According to an aspect of the invention, there is provided a light emitting device including: a light emitting element which includes a first electrode layer, a second electrode layer, and a light emitting function layer disposed between the first electrode and the second electrode; a reflection layer which reflects light emitted from the light emitting function layer toward the light emitting function layer; and a translucent semi-reflection layer which is disposed opposite the reflection layer with the light emitting function layer interposed therebetween to reflect some of the light emitted from the light emitting function layer toward the light emitting function layer and to transmit the remainder of the light. The translucent semi-reflection layer has a refractive index of 1 or more.

According to the light emitting device having the above-described configuration, it is possible to suppress a bad effect such as image quality deterioration caused due to reflection of external light incident on the light emitting device. A reason for suppressing of the bad effect will be described below.

The light emitting device having the above-described configuration has a resonating structure which includes the light emitting element, the reflection layer, and the translucent semi-reflection layer. When a case where the refractive index of the translucent semi-reflection layer is 1 or more is supposed, the external light to be incident from the translucent semi-reflection layer is refracted within a corresponding layer under a condition which is not close to the total reflection condition. In contrast, when a case where the refractive index of the translucent semi-reflection layer is below 1 is supposed, the external light is refracted within the corresponding layer under a condition which is close to the total reflection condition.

When both the cases are compared to each other, it is considered that an absolute amount of reflected external light becomes smaller in the former case than that in the latter case. Accordingly, according to the light emitting device having the above-described configuration, an effect of reducing the reflected external light can be obtained.

The light emitting device having the above-described configuration may further include a color filter which is disposed opposite the light emitting function layer with the translucent semi-reflection layer interposed therebetween to transmit the light transmitted through the translucent semi-reflection layer. An optical distance between the reflection layer and an interface which is not opposite to the reflection layer in the translucent semi-reflection layer is determined on the basis of $d_2$ calculated from Formula (1):

$$d_2 = (p + 1/2) \cdot \lambda/2 - (\phi_1 - \phi_2) \cdot \lambda / 4\pi \qquad (1),$$

where $\lambda$ is a wavelength corresponding to a peak of transmissivity of the color filter, $\phi_1$ is a phase variation occurring when light having a wavelength $\lambda$ traveling from an opposite side of the light emitting function layer to the translucent semi-reflection layer reflects from an interface opposite the light emitting function layer of the translucent semi-reflection layer, $\phi_2$ is a phase variation occurring when light having a wavelength $\lambda$ traveling from the light emitting function layer to the reflection layer reflects from the reflection layer, and p is a positive integer.

According to the light emitting device having the above-described configuration, the above-described effect can be obtained more reliably since the resonating structure is configured on the basis of the optical distance for causing the attenuated interference. A more specific configuration or structure to meet the effect will be described in an embodiment.

The light emitting device having the above-described configuration may further include a color filter which is disposed opposite the light emitting function layer with the translucent semi-reflection layer interposed therebetween to transmit the light transmitted through the translucent semi-reflection layer. The translucent semi-reflection layer has a predetermined physical thickness $t_z$. In addition, an optical distance between the reflection layer and an interface which is opposite to the reflection layer in the translucent semi-reflection layer is determined on the basis of $d_1$ calculated from Formula (2):

$$d_2=(p+1/2)\cdot\lambda/2-(\phi_1-\phi_2)\cdot\lambda/4\pi-n_z\cdot t_z \qquad (2),$$

where $\lambda$ is a wavelength corresponding to a peak of transmissivity of the color filter, $\phi_1$ is a phase variation occurring when light having a wavelength $\lambda$ traveling from an opposite side of the light emitting function layer to the translucent semi-reflection layer reflects from an interface opposite the light emitting function layer of the translucent semi-reflection layer, $\phi_2$ is a phase variation occurring when light having a wavelength $\lambda$ traveling from the light emitting function layer to the reflection layer reflects from the reflection layer, p is a positive integer, and $n_z$ is an refractive index for a wavelength $\lambda$ of the translucent semi-reflection layer.

According to the light emitting device, since the resonating structure is configured on the basis of the optical distance for causing the attenuated interference, the above-described effect of reducing the reflected external light is obtained more reliably. A more specific configuration or structure to meet the effect will be described in an embodiment.

The variation (which is caused due to adjustment or error of various parameters used in a manufacturing process) in the physical thickness $t_z$ of the translucent semi-reflection layer generally triggers a variation in a refractive index. Accordingly, it is preferable that adjustment related to the refractive index to satisfy a condition that the refractive index is 1 or more may be performed by positively adjusting the physical thickness $t_z$.

In the light emitting device having the above-described configuration, the translucent semi-reflection layer may contain an alloy of at least two kinds of unit elements. In addition, an alloy composition of the translucent semi-reflection layer may be determined depending on a physical thickness of the translucent semi-reflection layer or the physical thickness of the translucent semi-reflection layer is determined depending on the alloy composition, when the refractive index varies depending on a variation in a composition ratio of one element of the unit elements and a variation in the physical thickness of the translucent semi-reflection layer.

According to the light emitting device, it is possible to appropriately adjust the refractive index of the translucent semi-reflection layer, by adjusting the physical thickness and the composition ratio of the alloy.

According to the light emitting device having the above-described configuration, designing a material of the translucent semi-reflection layer can be performed more freely. For example, on the assumption that the refractive index decreases with an increase in the composition ratio of one kind of a unit element and the refractive index increases with an increase in the physical thickness, the designing the material can be performed in such a manner that the composition ratio of the one kind of a unit element can be raised by relatively enlarging the physical thickness. Reversely, the physical thickness may be determined after a desired composition ratio of an alloy is determined.

Generally, optical properties such as transparency, mechanical, dynamic and physical properties such as sensitivity (the coefficient of thermal expansion, etc) caused by a variation in strength and temperature, and chemical properties such as tolerance to various chemicals can vary in accordance with the variation in the composition ratio of the alloy. Accordingly, it is preferable that a material having a certain composition ratio of the alloy is determined in consideration of various situations in an actual device.

The light emitting device having the above-described has an advantage in that the refractive index can be adjusted by adjusting the thickness even after the preferable composition ratio of the alloy is initially determined in consideration of the situation. In this way, it is possible to provide the translucent semi-reflection layer which satisfies various demands as a whole.

In the light emitting device having the above-described configuration, the translucent semi-reflection layer may contain MgAg.

According to the light emitting device, the translucent semi-reflection layer can have "the refractive index of 1 or more". In addition, when MgAg is used as a material for constituting the translucent semi-reflection layer, it is preferable that the film thickness is 12.5 nm or more. In addition, as for the composition ratio of MgAg, it is preferable that a ratio of Ag is 10 or less when a ratio of Mg is fixed to 10. The marginal meaning will be described in an embodiment of the invention.

According to another aspect of the invention, there is provided an electronic apparatus including the above light emitting device having the above-described configuration.

Since the electronic apparatus includes the light emitting device having the above-described configuration, the effect of reducing the reflection of external light is achieved. Accordingly, it is possible to display an image with a high quality.

BRIEF DESCRIPTION OF THE DRAWINGS

The invention will be described with reference to the accompanying drawings, wherein like numbers reference like elements.

FIG. 3 is a diagram illustrating an upper graph that shows a relationship between a refractive index of a second electrode layer shown in FIG. 1 and a wavelength of incident light in a case of setting the film thickness of the second electrode layer as a parameter, and a lower graph that shows a simulation result of reflectivity of green light in the light emitting device in FIG. 1 in the case of setting the film thickness of the second electrode layer as the parameter.

FIG. 4 is a diagram illustrating examples of values to be substituted to Formulas (4) to (6) and Formulas (8) to (10) described in the specification.

FIG. 5 is a diagram illustrating a group of film thickness of layers shown in FIG. 1 to be used in a reflectivity calculating simulation shown in FIGS. 3, 6, and 7.

DESCRIPTION OF EXEMPLARY EMBODIMENTS

Figure 1:
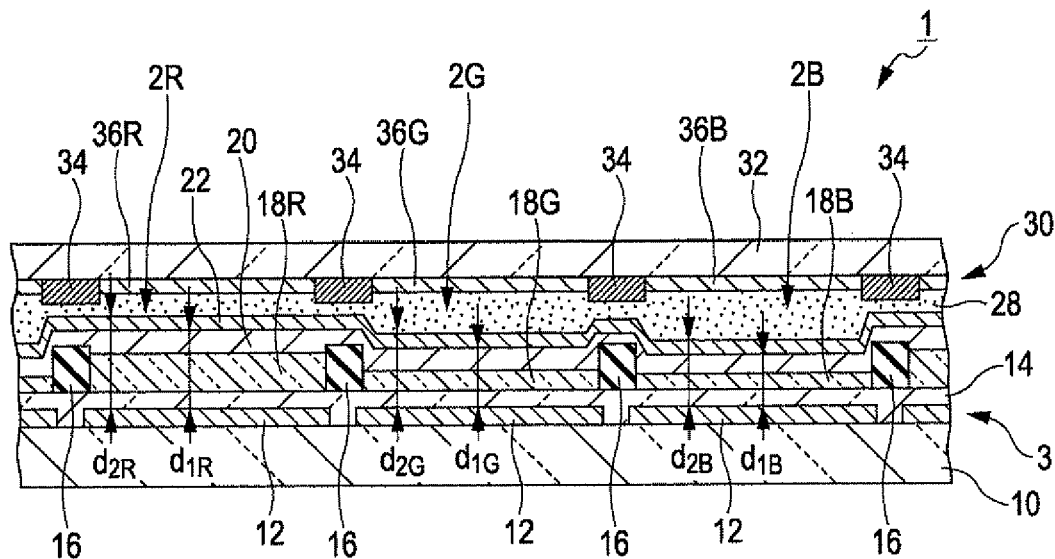
FIG. 1 is a schematic sectional view illustrating a light emitting device according to an embodiment of the invention.

Hereinafter, an embodiment of the invention will be described with reference to the drawings. In the drawings, elements are expressed in different scales from those of actual element.

Cross Section Structure of Organic EL Device

FIG. 1 is a schematic sectional view illustrating an organic EL device (light emitting device) 1 according to this embodiment of the invention. The organic EL device 1 includes a light emitting panel 3 and a color filter panel 30.

The light emitting panel 3 includes a plurality of light emitting elements (pixels) 2 (2R, 2G, and 2B), as shown in the figure. According to this embodiment, the organic EL device 1 is used as a full-color image display device. The light emitting element 2R is a red light emitting element which emits red emission light, the light emitting element 2G is a green light emitting element which emits green emission light, and the light emitting element 2B is a blue light emitting element which emits blue emission light. Even though just the three light emitting elements 2 are shown in FIG. 1, light emitting elements more than the illustrated light emitting elements are provided as a matter of fact. Hereinafter, subscript R, G, and B of the constituent elements correspond to the light emitting elements 2R, 2G, and 2B, respectively.

The illustrated light-emitting panel 3 is of a top emission type. The light-emitting panel 3 includes a substrate 10. The substrate 10 may be made of a transparent material such as glass or may be made of an opaque material such as ceramic or metal.

A reflection layer 12 having an uniform thickness is formed at a position overlapping with the light emitting elements 2 on the substrate 10. Since the reflection layer 12 is made of a material such as aluminum or silver having a high reflection ratio, the reflection layer 12 reflects light (including light emitting from the light emitting elements 2) traveling from the light emitting elements 2 upward in FIG. 1.

An insulating transparent layer 14 is formed on the substrate 10 so as to cover the reflection layer 12. The insulating transparent layer 14 is made of an insulating material such as SiN having a high light transmission property. Even though not shown, TFTs (Thin Film Transistor) for feeding power to the light emitting elements 2 and wirings are formed in the insulating transparent layer 14. The insulating transparent layer 14 on the reflection layer 12 has a uniform thickness, irrespective of the light emission colors of the light emitting elements 2 overlapping with the insulating transparent layer 14.

Separators 16 for separating the light emitting elements 2 are formed on the insulating transparent layer 14. The separators 16 are made of an insulating resin material such as acrylic, epoxy, or polyimide.

Each of the light emitting elements 2 includes a first electrode layer 18, a second electrode layer 22, and a light emitting function layer 20 interposed between the first electrode layer 18 and the second electrode layer 22.

In this embodiment, each of the first electrode layers 18 (18R, 18G, and 18B) is a pixel electrode disposed in each of the pixels (light emitting elements 2), and is an anode, for example. The first electrode layers 18 are made of a transparent material such as ITO (Indium Tin Oxide) or $ZnO_2$. The thickness of the first electrode layers 18 depends on a light emission color. That is, the first electrode layers 18R, 18G, and 18B have a different thickness.

In this embodiment, the light emitting function layer 20 is formed commonly in the plurality of light emitting elements 2, and has a uniform thickness, irrespective of the light emission colors of the light emitting elements 2. The light emitting function layer 20 has at least an organic light emitting layer. The organic light emitting layer emits white light when current flows. That is, the organic light emitting layer emits light having an optic component of a red color, a green color, and a blue color. The organic light emitting layer may have a single layer structure or may have a multi-layer structure (for example, a blue light emitting layer which emits blue light when current flows and a yellow light emitting layer which emits yellow light including red light and green light when current flows).

Even though not shown, the light emitting function layer 20 may include a hole transport layer, a hole injection layer, an electron block layer, a hole block layer, an electron transport layer, an electron injection layer, and the like in addition to the organic light emitting layer. When the light emitting function layer 20 includes a plurality of layers, each of the layers has a uniform thickness, irrespective of the light emission colors of the light emitting elements 2.

The second electrode layer (translucent semi-reflection layer) 22 is made of a translucent semi-reflection alloy such as MgAl, MgCu, MgAu, or MgAg or a metal material. In this embodiment, the second electrode layer 22 is a common electrode disposed commonly in the plurality of pixels (light emitting elements), and is a cathode, for example. The second electrode layer 22 has a uniform thickness, irrespective of the light emission colors of the light emitting elements 2. The second electrode layer 22 transmits the remainder of light (including light emitting from the light emitting function layer 20) traveling from the light emitting function layer 20 upward in the figure and reflects some of the light downward in the figure, that is, toward the first electrode layers 18.

It is preferable that the second electrode layer 22 is made of a material such as MgAg having a reflective index of 1 or more among the above-described materials, which will be described again with reference to more specific data, when an operational advantage is described below.

The light emitting function layer 20 comes in contact with each of the first electrode layers 18 in an inside of openings formed between the plurality of separators 16. At this time, when current flows between each of the first electrode layers 18 and the second electrode layer 22 in the light emitting elements 2, holes are supplied from the first electrode layers 18 to the light emitting function layer 20 in the light emitting elements 2, electrons are supplied from the second electrode layer 22, and thus the holes and the electrons are combined to emit light. Accordingly, light emission areas of the light emitting elements 2 are mainly determined in pixel openings formed between the separators 16. That is, the pixel openings of the separators 16 divide the pixel electrodes 2.

Figure 2:
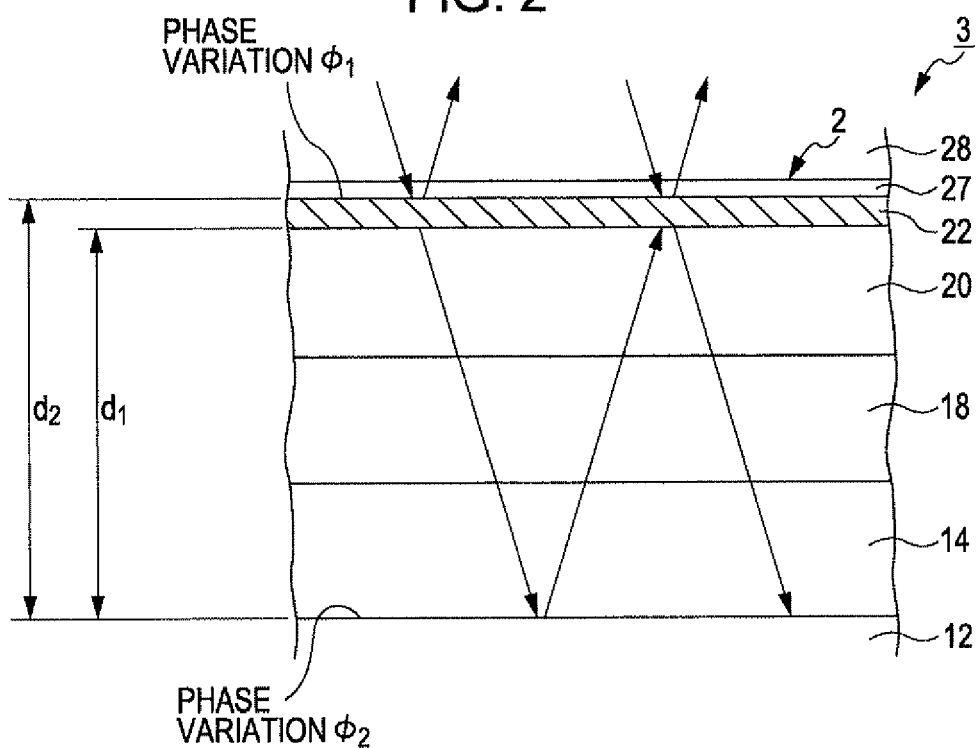
FIG. 2 is a schematic diagram illustrating a light locus when external light travels toward a light emitting element of a light emitting panel through a color filter in the light emitting device in FIG. 1.

As shown in FIG. 2, a very thin passivation layer 27 is formed on the second electrode layer 22. Since the passivation layer 27 is made of an inorganic transparent material such as SiON, the passivation layer 27 particularly prevents deterioration of the light emitting function layer 20 of the light emitting elements 2 which is caused due to moisture or oxygen. In this way, the light emitting panel 3 is formed.

The light emitting function layer 20 emits white light. However, since light reciprocates between the reflection layer 12 and the second electrode layer 22, the light emitting elements 2 each emit amplified light having a specific wavelength. That is, the light emitting element 2R emits amplified light having a red wavelength, the light emitting element 2G emits amplified light having a green wavelength, and the light emitting element 2B emits amplified light having a blue wavelength. In order to emit the light having the specific wavelengths, the light emitting elements 2R, 2G, and 2B each have an optical distance $d_1$ ($d_{1R}$, $d_{1G}$, $d_{1B}$) between the reflection layer 12 and the second electrode layer 22. In the figure, $d_1$ ($d_{1R}$, $d_{1G}$, $d_{1B}$) and $d_2$ ($d_{2R}$, $d_{2G}$, $d_{2B}$) denote optical distances and do not represent actual distances.

A color filter panel 30 are adhered to the light emitting panel 3 by a transparent adhesive 28. The color filter panel 30 includes a substrate 32 made of a transparent material such as glass, black matrixes 34 formed on the substrate 32, and color filters 36 (36R, 36G, and 36B) disposed in openings formed in the black matrixes 34.

The adhesive 28 is disposed between the color filters 36 of the color filter panel 30 and the passivation layer 27 (see FIG. 2) of the light emitting panel 3 to support the substrate 32 of the color filter panel 30 and the color filters 36 in parallel respective to the layers of the light emitting panel 3

The color filters 36 are each disposed at a position overlapping with the first electrode layers 18. The color filters 36, which are disposed opposite the light emitting function layer 20 with the second electrode layer 22 having a translucent semi-reflection property interposed therebetween, transmit the light which has been transmitted through the second electrode layer 22 of the light emitting elements 2 overlapping with the color filters 36.

Hereinafter, more details will be described.

Since the color filter 36R overlaps with the light emitting element 2R, the color filter 36R and the light emitting element 2R form a set. The color filter 36R has a function of transmitting red light and a peak wavelength of its transmissivity is 610 nm. The color filter 36R transmits the amplified red light which has been transmitted through the second electrode layer 22 of the light emitting element 2R overlapping with the color filter 36R to improve the purity of red light. In addition, the color filter 36R absorbs most of green and blue light.

Since the color filter 36G overlaps with the light emitting element 2G, the color filter 36G and the light emitting element 2G form a set. The color filter 36G has a function of transmitting green light and a peak wavelength of its transmissivity is 550 nm. The color filter 36G transmits the amplified green light which has been transmitted through the second electrode layer 22 of the light emitting element 2G overlapping with the color filter 36G to improve the purity of green light. In addition, the color filter 36G absorbs most of red and blue light.

Since the color filter 36B overlaps with the light emitting element 2B, the color filter 36B and the light emitting element 2B form a set. The color filter 36B has a function of transmitting blue light and a peak wavelength of its transmissivity is 470 nm. Since the color filter 36B overlaps with the light emitting element 2B, the color filter 36B transmits the amplified blue light which has been transmitted through the second electrode layer 22 of the light emitting element 2B, thereby improving the purity of blue light. In addition, the color filter 36B absorbs most of red and green light.

Light Reflection and Transmission Model

FIG. 2 is a schematic diagram illustrating a light locus when external light travels toward each of the light emitting elements 2 of the light emitting panel 3 through each of the color filters 36. The external light transmitted through each of the color filters 36 reaches the second electrode layer 22 having a translucent semi-reflection property through the transparent adhesive 28 and the passivation layer 27. Some of the external light reflects from an interface (which is opposite to the light emitting function layer 20 of the second electrode layer 22) between the passivation layer 27 and the second electrode layer 22. A phase variation of some of the external light is denoted by $\phi_1$.

The remainder of the external light is transmitted through the second electrode layer 22 having a translucent semi-reflection property, the light emitting function layer 20, the first electrode layers 18, and the insulating transparent layer 14 to reflect from the surface of the light emitting function layer 20 of the reflection layer 12. A phase variation of the remainder of the external light is denoted by $\phi_2$.

The light reflecting from the reflection layer 12 is transmitted through the insulating transparent layer 14, the first electrode layers 18, and the light emitting function layer 20. Some of the reflected light is transmitted through the second electrode layer 22 having translucent semi-reflection property and travels from the light emitting elements 2 to the adhesive 28 to interfere with the light reflecting from the interface between the passivation layer 27 and the second electrode layers 22. In FIG. 2, a change in a light path caused by light refraction in each interface is not shown, and the light path is represented by a straight line.

In order to reduce the light reflecting from each interface by attenuated interference, it is very suitable to meet Formula (3):

$$2 \cdot d_2 = (p+1/2) \cdot \lambda - (\phi_1 - \phi_2) \cdot \lambda / 2\pi \quad (3),$$

where $d_2$ is an optical distance [nm] between an interface of the reflection layer 12 close to the light emitting function layer 20 and an interface of the second electrode layer 22 opposite the light emitting function layer 20. The optical distance $d_2$ is a sum of a product of the refractive indexes and the thickness of the insulating transparent layer 14, the second electrode layer 22, and the layers therebetween.

$\lambda$ in Formula (3) is a wavelength [nm] of an optical component to be attenuated. Since the external light is light transmitted through the color filter 36 and traveling toward the light emitting panel, the external light is light in a transmission wavelength area of the color filter 36. Accordingly, as for $\lambda$ of Formula (3), it is appropriate to take a wavelength corresponding to a peak of transmissivity of the color filter 36.

$\phi_1$ in Formula (3) is a phase variation [rad] occurring when light having a wavelength $\lambda$ traveling from a side opposite the light emitting function layer 20 to the second electrode layer 22 reflects from an interface opposite the light emitting function layer 20 of the second electrode layer 22 having a translucent semi-reflection property. $\phi_2$ is a phase variation [rad] occurring when light having a wavelength $\lambda$ traveling from a side of the light emitting function layer 20 to the reflection layer 12 reflects toward the reflection layer 12. p is a positive integer and it is preferable that p is 1.

Such Formula (3) can be expressed as individual formulas for the light emitting elements 2R, 2G, and 2B of red, green, blue colors, respectively:

$$d_{2R} = (p+1/2) \cdot \lambda_R / 2 - (\phi_{1R} - \phi_{2R}) \cdot \lambda_R / 4\pi \quad (4),$$

$$d_{2G} = (p+1/2) \cdot \lambda_G / 2 - (\phi_{1G} - \phi_{2G}) \cdot \lambda_G / 4\pi \quad (5), \text{ and}$$

$$d_{2B} = (p+1/2) \cdot \lambda_B / 2 - (\phi_{1B} - \phi_{2B}) \cdot \lambda_B / 4\pi \quad (6),$$

where $d_{2R}$ is an optical distance $d_2$ for the light emitting element 2R, $\lambda_R$ is a wavelength of 610 nm corresponding to the peak of transmissivity of the color filter 36R, $\phi_{1R}$ is $\phi_1$ in the wavelength $\lambda_R$, and $\phi_{2R}$ is $\phi_2$ in the wavelength $\lambda_R$, where $d_{2G}$ is an optical distance $d_2$ for the light emitting element 2G, $\lambda_G$ is a wavelength of 550 nm corresponding to the peak of transmissivity of the color filter 36G, $\phi_{1G}$ is $\phi_1$ in the wavelength $\lambda_G$, and $\phi_{2G}$ is $\phi_2$ in the wavelength $\lambda_G$, and where $d_{2B}$ is an optical distance $d_2$ for the light emitting element 2B, $\lambda_B$ is a wavelength of 470 nm corresponding to the peak of transmissivity of the color filter 36B, $\phi_{1B}$ is $\phi_1$ in the wavelength $\lambda_B$, and $\phi_{2B}$ is $\phi_2$ in the wavelength $\lambda_B$.

An optical distance $d_1$ [nm] between the reflection layer 12 and the second electrode layer 22 and the optical distance d2 between an interface of the reflection layer 12 close to the light emitting function layer 20 and an interface of the second electrode layer 22 opposite the light emitting function layer 20 satisfy a relationship of Formula (7):

$$d_1 = d_2 - n_z \cdot t_z, \text{ therefore, and}$$

$$d_1 = (p+1/2) \cdot \lambda / 2 - (\phi_1 - \phi_2) \cdot \lambda / 4\pi - n_z \cdot t_z \quad (7),$$

where $n_z$ is a refractive index of the second electrode layer 22 for light having a wavelength $\lambda$ and $t_z$ is a thickness of the second electrode layer 22.

Therefore, Formula (7) can be expressed as Formulas (8) to (10) for the light emitting elements 2R, 2G, and 2B, respectively:

$$d_{1R} = (p+1/2) \cdot \lambda_R / 2 - (\phi_{1R} - \phi_{2R}) \cdot \lambda_R / 4\pi - n_{zR} \cdot t_z \quad (8),$$

$$d_{1G} = (p+1/2) \cdot \lambda_G / 2 - (\phi_{1G} - \phi_{2G}) \cdot \lambda_G / 4\pi - n_{zG} \cdot t_z \quad (9),$$

and $$d_{1B} = (p+1/2) \cdot \lambda_B / 2 - (\phi_{1B} - \phi_{2B}) \cdot \lambda_B / 4\pi - n_{zB} \cdot t_z \quad (10),$$

where $d_{1R}$ is an optical distance $d_1$ for the light emitting element 2R and $n_{zR}$ is a refractive index $n_z$ of the second electrode layer 22 for light having the wavelength $\lambda_R$, where $d_{1G}$ is an optical distance $d_1$ for the light emitting element 2G and $n_{zG}$ is a refractive index $n_z$ of the second electrode layer 22 for light having the wavelength $\lambda_G$, and where $d_{1B}$ is an optical distance $d_1$ for the light emitting element 2B and $n_{zB}$ is a refractive index $n_z$ of the second electrode layer 22 for light having the wavelength $\lambda_B$.

The very suitable condition has been described above in order to reduce the light reflecting from each interface by the attenuated interference.

Operational Advantage of Organic EL Device

Hereinafter, an operational advantage of the organic EL device having the above-described configuration will be described with reference to FIGS. 3 to 9 in addition to FIGS. 1 and 2.

FIGS. 3 to 9 show a result that an optical simulation was carried out using the organic EL device having the above-described configuration. The simulation result can be obtained using an optical simulation program, which is "Opt-Designer", a product name, made by Toyota Central R&D Labs., Inc. In addition, the same is applied to FIGS. 10 to 14 described below.

Film Thickness and Refractive Index

First, before describing the operational advantage of the organic EL device according to this embodiment, a relationship between the thickness and the refractive index of the second electrode layer 22 will be described.

An upper graph in FIG. 3 shows such a relationship.

As shown in the figure, it can be known that the refractive index increases in proportion to the increase in the wavelength, irrespective of a difference in the thickness of the second electrode layer 22.

In addition to the proportional relationship between the refractive index and the wavelength, it can be known that the refractive index increases as the thickness of the second electrode layer 22 increases. That is, in FIG. 3, reflective indexes of a film thickness T1=11 nm, a film thickness T2=12.5 nm, and a film thickness T3=20 nm are shown. In the case of the film thickness T1, the refractive index does not become 1 until the wavelength of 600 nm and a half. In contrast, in the cases of the film thicknesses T2 and T3, the refractive indexes become 1 or more across the entire wavelength area. In particular, in FIG. 3, it can be known that a marginal value for the refractive index of 1 or more across the entire wavelength area is the film thickness T2.

The result from the upper graph in FIG. 3 can be obtained from the course of evaluating a complex refractive index $n_c = n - jk$. "A refractive index" of a vertical axis in the figure refers to a value of the real number n. An extinction coefficient k is also evaluated, but is not shown in FIG. 3. At the left upper portion of FIG. 3, an expression of "REAL NUMBER OF REFRACTIVE INDEX" is shown to indicate such an intention. The same is applied to FIGS. 10 and 11 which are referred below.

The result from the upper graph in FIG. 3 is obtained using the second electrode layer 22 made of an alloy of Mg and Ag, and is obtained on the basis of a case where the former and the latter in the ratio by weight of 10 to 1. The same is applied to FIGS. 4 to 9.

In FIG. 3, in addition to the relationship between the variation and the refractive indexes of the thicknesses T1, T2, and T3, a relationship between the variation in the film thicknesses T1, T2, and T3 and the reflectivity of external light is shown in a lower graph. In addition, the lower graph relates to the reflectivity of external light of a green color. This reflectivity can be evaluated on the basis of a ratio of an intensity of reflecting light transmitted through the color filter 36 and an intensity of original isoenergetic white light, on the assumption that the isoenergetic white light is transmitted through the color filter 36 and reaches the light emitting panel 3. The same is applied to FIGS. 6 to 9 and FIGS. 12 to 14.

This result is based on Formulas (5) and (9) described above. That is, $d_{2G}$ for causing the attenuated interference of reflecting light is evaluated from Formula (5), and $d_{1G}$ for causing the attenuated interference of the reflecting light is evaluated from Formula (9). As for $d_{1G}$, the thickness $t_z$ of the second electrode layer 22 in Formula (9) is each substituted by T1, T2, and T3. The result of the figure can be obtained on the basis of the three types of $d_{1G}$ and $d_{2G}$, which can be evaluated by the substitution, by setting the cross section structure of the light emitting element 2G of the organic EL device using the simulation program.

In order to evaluate $d_{1G}$ and $d_{2G}$ described above, for example, values in FIG. 4 (in this case, values in a column of "LIGHT EMITTING ELEMENT 2G" in FIG. 4, since the green light is associated) can be used as values to be substituted in Formulas (5) and (9). When the values are used, $d_{1G}$ and $d_{2G}$ become about $d_{1G}=406.2$ nm and about $d_{2G}=422.0$ nm, respectively, on the assumption that p is 1 and $n_{zG}$ and $t_z$ are 1.24 and 12.5 nm, respectively.

When the simulation is carried out, it is assumed that a thickness of the insulating transparent layer 14 and a thickness of the light emitting function layer 20 for the light emitting elements 2R, 2G, and 2B are equal to each other, and a thickness of the first electrode layer 18 for the light emitting elements 2R, 2G, and 2B are different from each other.

When the simulation is carried out, a material, a thickness, and a refractive index of each layer are set using values in FIG. 5. When a value of $d_{1G}'$ corresponding to $d_{1G}$ is calculated in accordance with the value shown in the figure, $d_{1G}'$ becomes about 426.3 nm. The reason why there is a difference between $d_{1G}'$ and $d_{1G}$ described above is that reflection caused by interfaces between layers constituting a laminated structure is not considered in Formulas (5) and (9) which are used to calculate the latter. Accordingly, $d_{1G}'$ and $d_{1G}$ cannot be necessarily equal to each other, but there is no change in a situation where $d_{1G}'$ is based on $d_{1G}$.

Figure 6:
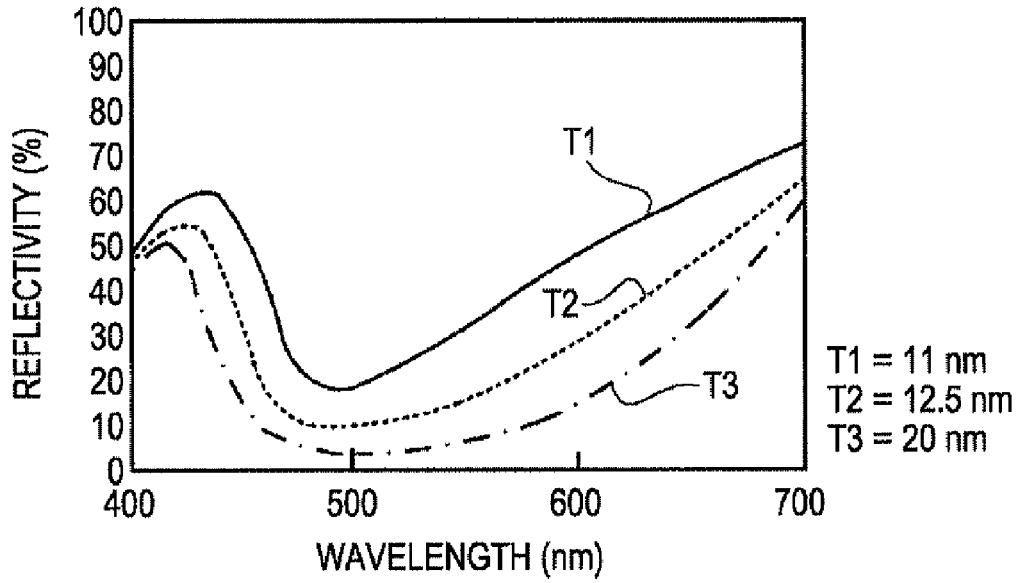
FIG. 6 is a graph showing the result of a reflectivity simulation for blue light in the light emitting device in FIG. 1 when the film thickness of the second electrode layer is set as a parameter.
Figure 7:
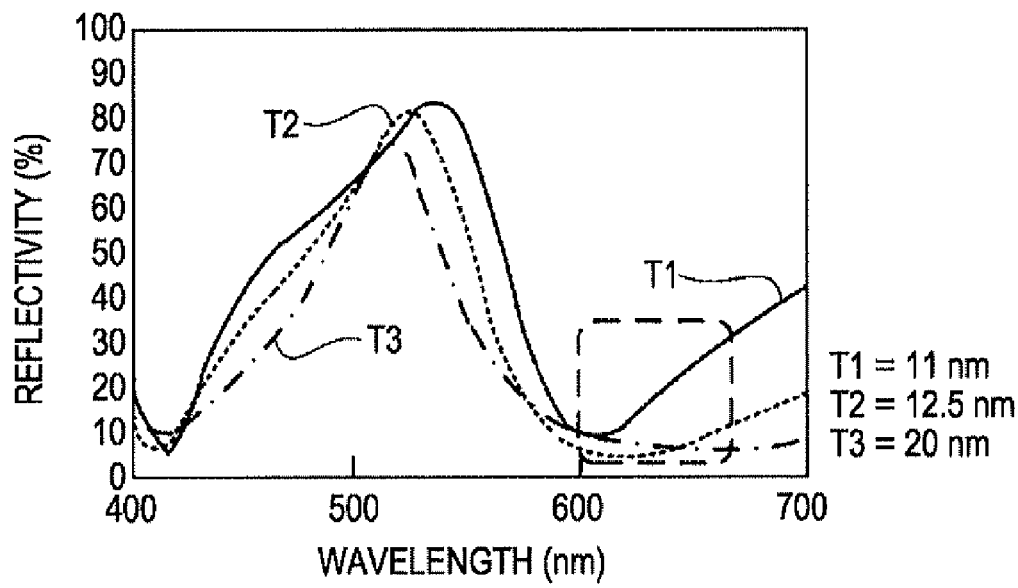
FIG. 7 is a graph showing the result of a reflectivity simulation for red light in the light emitting device in FIG. 1 when the film thickness of the second electrode layer is set as a parameter.

In FIGS. 4 and 5, values for blue color light and red color light described below in FIGS. 6 and 7 are also shown.

As shown in the lower graph in FIG. 3, it can be known that reflectivity decreases or increases at a uniform period with respect to a wavelength. However, it can be known that the reflectivity of either the film thickness T1, T2, or T3 decreases near the peak wavelength of 550 nm for the green light. At this time, the shape of the decrease in the reflectivity is different depending on the difference in the film thicknesses T1, T2, and T3. That is, the least effect of reducing the reflectivity at the peak wavelength of 550 nm is shown in the film thickness T1. In contrast, the effect of reducing the reflectivity is improved in the film thickness T3 and is the most excellent in the film thickness T2. However, the almost same effect is shown in the film thicknesses T2 and T3.

As a result, it can be known that there correlation between the effect of reducing the reflectivity and the refractive index described with reference to the upper graph in FIG. 3. That is, it can be concluded that the more effect of reducing the reflectivity can be obtained when the refractive index is 1 or more.

Such correlation between the refractive index and the effect of reducing the reflectivity can be also confirmed from the following description.

First, notice the minimum values of curves showing the reflectivity varying with the wavelength in the lower graph in FIG. 3. As shown in the lower graph, the minimum values are denoted by m1, m2, and m3 of the curves for the film thicknesses T1, T2, and T3.

Next, confirm how the refractive index of the second electrode layer 22 varies with respect to the wavelengths corresponding the minimum values m1, m2, and m3. In FIG. 3, the variation in the refractive index can be visually grasped. For example, a line segment R1 extending from the minimum value m1 toward the upper graph meets a curve of the wavelength and the refractive index shown in the upper graph in FIG. 3. In this case, it can be known that the refractive index corresponding to the minimum m1 is 1 or less since the curve of the wavelength and the refractive index relates to the film thickness T1.

The same is applied to line segments R2 and R3. In this case, it can be known that either end point of the segment R2 or R3 is a point where the refractive index is 1 or more in the upper graph in FIG. 3.

From the above description, the followings can be speculated. That is, Formulas (5) and (9) described above are formulas for calculating $d_{1G}$ and $d_{2G}$ for causing the attenuated interference as described above, and can be also formulas for calculating $d_{1G}$ and $d_{2G}$ for the minimum reflectivity with respect to the wavelength $\lambda_G$ and a wavelength near the wavelength $\lambda_G$. Since the simulation is carried out under the almost same condition for $d_{1G}$ and $d_{2G}$, it can be considered that the minimum values m1, m2, and m3 shown in the lower graph in FIG. 3 reflect $d_{1G}$ and $d_{2G}$ for the minimum reflectivity, of course. In particular, as shown in Formula (9), $d_{1G}$ varies with the refractive index $n_{zG}$ (and the physical thickness $t_{zG}$) of the second electrode layer 22.

It can be summarized that a series of relationships are prevent in such the manner that the variation in the refractive index $n_{zG}$ influences $d_{1G}$, and then $d_{1G}$ also influences the effect of reducing the reflectivity, specifically, the minimum values m1, m2, and m3.

As for the minimum values m1, m2, and m3, it can be known that there is a considerable difference W between the minimum value m1 and minimum value m2 or m3. Moreover, on the assumption that there is a relationship that the refractive index $n_{zG}$ for the former is less than 1 and the refractive index $n_{zG}$ for the latter is 1 or more, as described above, it can be concluded that there is also a correlation about whether the considerable difference W occurs depending on the fact that the refractive index $n_{zG}$ is less than 1 or 1 or more.

The fact that there is the above-mentioned correlation can be understood from FIG. 3, but its cause is not clear. In this case, the case of the refractive index $n_{zG}$ less than 1 generally means that the refractive angle respective to an incident angle increases. Accordingly, as the refractive angle increases, a total refraction condition is satisfied. Accordingly, it is supposed that an amount of reflecting light generally increases. Therefore, even though $d_{1G}$ and $d_{2G}$ for causing the attenuated interference are calculated using Formulas (5) and (9), it is considered that an interference effect is relatively or actually weaker as long as the refractive index $n_{zG}$ is less than 1, compared to the case where the refractive index $n_{zG}$ is 1 or more.

As described above, it is possible to obtain a better effect of reducing the reflectivity as long as the refractive index $n_{zG}$ is 1 or more.

FIGS. 6 and 7 are graphs for explaining the same purpose as that of the lower graph in FIG. 3 and showing a relationship between a variation in the film thicknesses T1, T2, and T3 and reflectivity of external light. The former relates to blue light and the latter relates to red light. Formulas (6) and (10) described above are used in FIG. 6 and Formulas (4) and (8) are used in FIG. 7, like the above-described green light.

In FIG. 6 (blue light), it can be known that as the film thickness of the second electrode layer 22 increases, the effect of reducing the reflectivity is obtained like or more apparently than the effect in FIG. 3. Moreover, in FIG. 7 (red light), it can be known that there is no considerable difference in the film thicknesses T1, T2, and T3 in a small wavelength area, but the tendency shown in FIG. 3 is shown near the wavelength of 610 nm. That is, as shown in an area (see an enclosed dash line in FIG. 7) from a wavelength of 600 nm to a half thereof, there is a considerable difference between the film thickness T1, that is, the refractive index $n_{zR}$ less than 1 and the film thickness T2 or T3, that is, the refractive index $n_{zR}$ of 1 or more. The reflectivity in the former increases more steeply than that in the latter. Such a phenomenon is also shown near the wavelength of 470 nm in FIG. 6.

Figure 8:
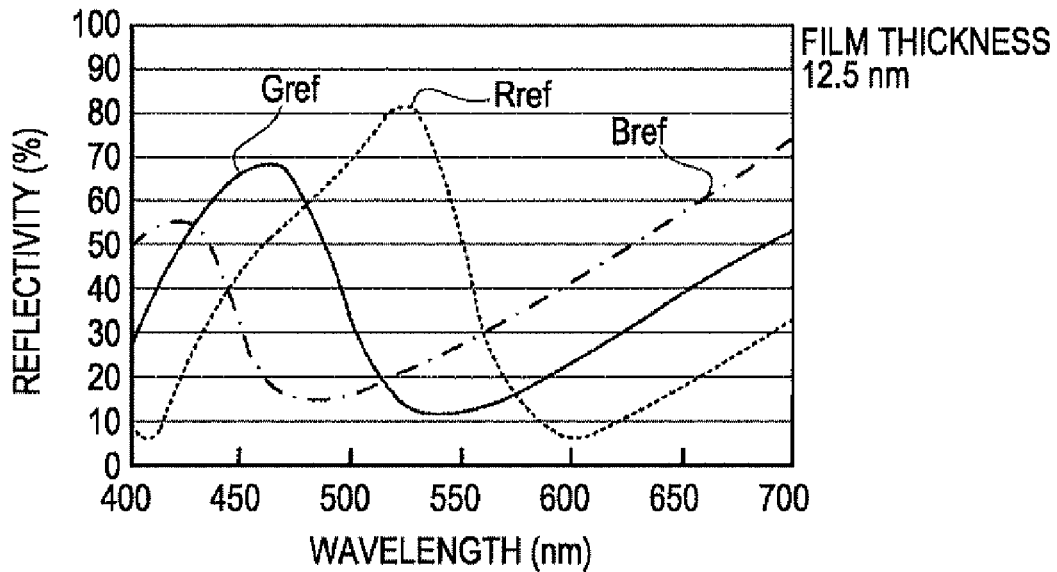
FIG. 8 shows the simulation results of the lower graph (green light) in FIG. 3, the graph (blue light) in FIG. 6, the graph (red light) in FIG. 7 together when the film thickness T2 of the second electrode layer is 12.5 nm.

FIG. 8 shows the above-described simulation results of the lower graph in FIG. 3 and the graphs in FIGS. 6 and 7 together when the film thickness of the second electrode layer 22 is 12.5 nm (that is, the film thickness T2 in FIGS. 3, 6, and 7). The reason for selecting the film thickness T2=12.5 nm is that a marginal value of the film thickness where the refractive index is 1 or more in the entire wavelength area is T2 (see FIG. 3).

As shown in FIG. 8, a curve Gref has a very low reflectivity value near the peak wavelength of 550 nm, a curve Bref has a very low reflectivity value near the peak wavelength of 470 nm, and a curve Rref has a very low reflectivity value near the peak wavelength of 610 nm.

Figure 9:
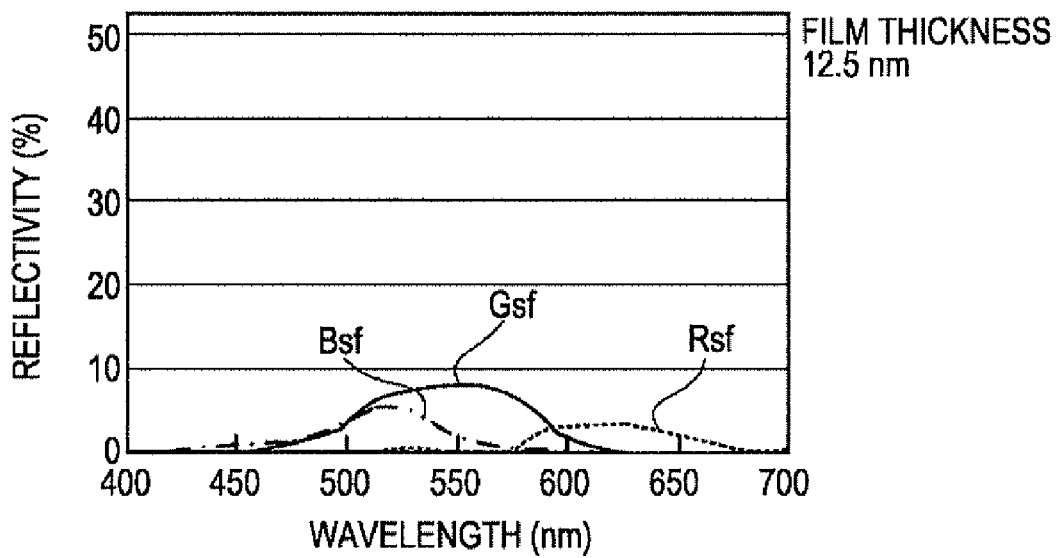
FIG. 9 is a graph showing the simulation result of the reflectivity as a visibility property obtained on the basis of FIG. 8.

From the result for the whole colors, as shown in FIG. 9, the reflectivity as a visibility property is very excellent since the visibility property is 10% or less for any color. In addition to FIG. 9, the reduction in the reflectivity near the peak wavelengths of the respective colors reflect the result in the lower graph in FIG. 3 and the result in the graphs in FIGS. 6 and 7. Meanwhile, a reduction in the reflectivity in wavelength areas other than the peak wavelength areas reflects an absorption effect of the color filter 36. For example, since the color filter 36G absorbs light in the wavelength area other than the vicinity of the peak wavelength of 550 nm in a curve Gsf in FIG. 9, a reflectivity value is lowered (the same is applied to curves Bsf and Rsf).

The reflectivity as the visibility property described above means reflectivity at the time of viewing the plurality of light emitting elements 2 through the color filter 36. Specifically, the reflectivity can be obtained by integrating the graph in FIG. 8.

As described above, the organic EL device according to this embodiment can obtain the effect of reducing the reflectivity more effectively in a case where the refractive index of the second electrode layer 22 is 1 or more.

As described above and from FIG. 3, it is clear that the refractive index of the second electrode layer 22 should be 1 or more at an optical wavelength of 400 nm. As for the maximum refractive index of the second electrode layer 22, this desirably sets based on the at the optical wavelength of 800 nm. In this case, the maximum reflectivity of the second electrode layer 22 is 3 or smaller than 3. For example FIG. 3 shows that the reflectivity of the second electrode layer 22 can be 2.5 at 800 nm.

Alloy Composition and Refractive Index

Next, an influence of a composition of the second electrode layer 22 on the refractive index of the second electrode layer 22 will be described.

Figure 10:
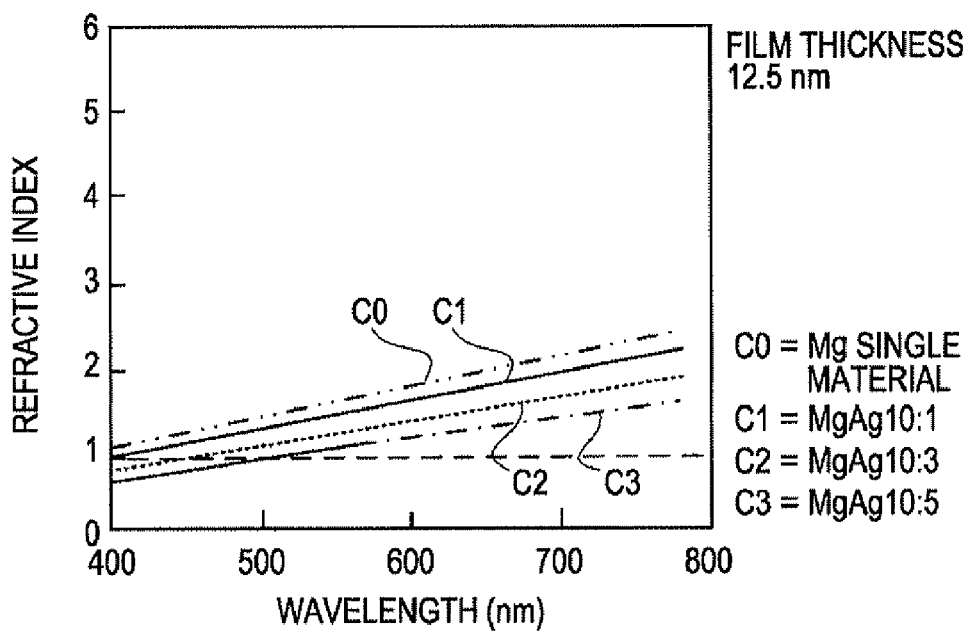
FIG. 10 is a graph showing a relationship between the refractive index and an incident light wavelength of the second electrode layer when a composition ratio of MgAg is set as a parameter and the film thickness of the second electrode layer is 12.5 nm.

FIG. 10 is a graph showing how the refractive index varies with a variation in a composition ratio of MgAg when the film thickness of the second electrode layer 22 is fixed to 12.5 nm (=T2), like FIGS. 8 and 9.

As shown in FIG. 10, it is confirmed that the refractive index gradually decreases when a ratio of Ag gradually increases from a case (see "C1" in the figure) where the composition ratio of MgAg is 10:1. In FIG. 10, a case of Mg:Ag=10:3 is denoted by "C2" and a case of Mg:Ag=10:5 is denoted by "C3". A case where Ag is not contained, that is, a case of an Mg single material is denoted by "C0".

Figure 11:
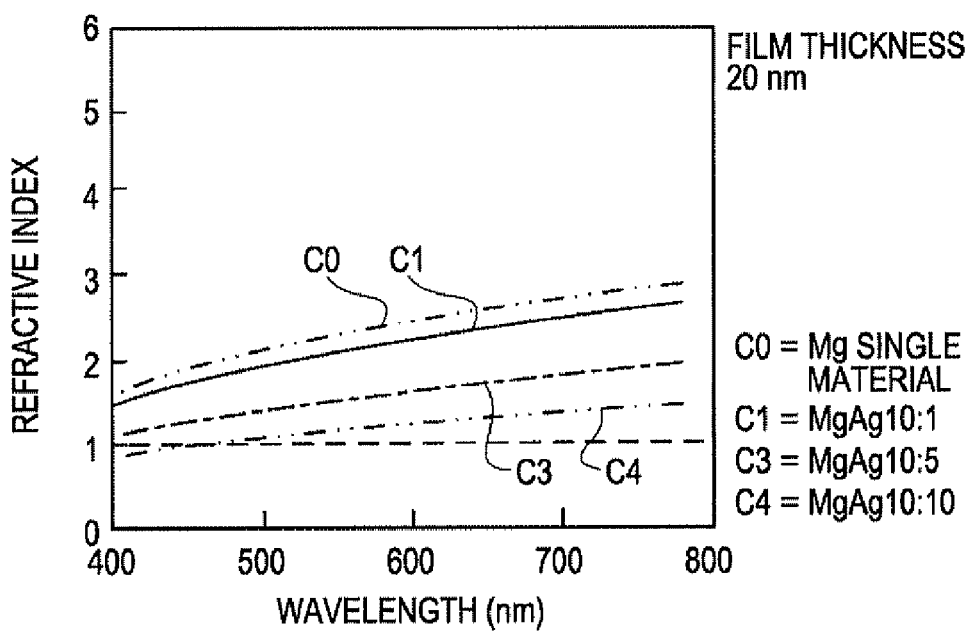
FIG. 11 is a graph showing a relationship between the refractive index and the incident light wavelength of the second electrode layer when a composition ratio of MgAg is set as a parameter and the film thickness of the second electrode layer is 20 nm.

FIG. 11 is a graph showing how the refractive index varies with an increase in the physical thickness of the second electrode layer 22 on the basis of FIG. 10. Specifically, in FIG. 11, since the film thickness of the second electrode layer 22 is set to 20 nm, the film thickness of the second electrode layer 22 is larger than the film thickness of 12.5 nm in FIG. 10.

As shown in FIG. 11, first, it can be known that the refractive ratio increases with an increase in the film thickness. For example, when a curve denoted by "C1" in FIG. 11 is compared to a curve denoted by "C1" in FIG. 10 (all the curves of Mg:Ag=10:1), it can be known that the refractive index for the larger film thickness increases more steeply across the entire wavelength area.

In FIG. 11, second, it can be known that the refractive index decreases with an increase in Ag in the composition ratio of MgAg. This tendency is the same the tendency described above with reference to FIG. 10. In addition, in FIG. 11, a case of Mg:Ag=10:10 is shown as "C4". The cases of "C0" and "C3" are the same as those in FIG. 10.

In sum, it can be known from FIGS. 10 and 11 that the refractive index decreases with the increase in Ag in the composition ratio of MgAg and the refractive index increases with the increase in the film thickness of the second electrode layer 22.

From viewpoint of the fact that the refractive index is preferably 1 or more, FIGS. 10 and 11 will be described again. In the case of the curve denoted by "C3" in FIG. 10, there is a wavelength area where the refractive index is 1 or less in a small wavelength area. However, in the case of the curve denoted by "C3" in FIG. 11 having even the same composition ratio, it can be known that the refractive ratio is 1 or more across the entire wavelength area. That is because the film thickness in FIG. 11 is set 20 nm, and thus is larger than the film thickness of 12.5 nm in FIG. 10.

In other words, in FIGS. 10 and 11, a relation where an increase in a ratio of Ag is possible to some extent can be understood from the fact that "an overall increase" in the above-described refractive index can be achieved by increasing the film thickness of the second electrode layer 22. In FIG. 11, eve though there is a portion where the refractive index is slightly below 1 near a wavelength of 400 nm, it is considered that a marginal composition ratio is set to Mg:Ag=10:10 on the assumption that the film thickness is 20 nm.

Figure 12:
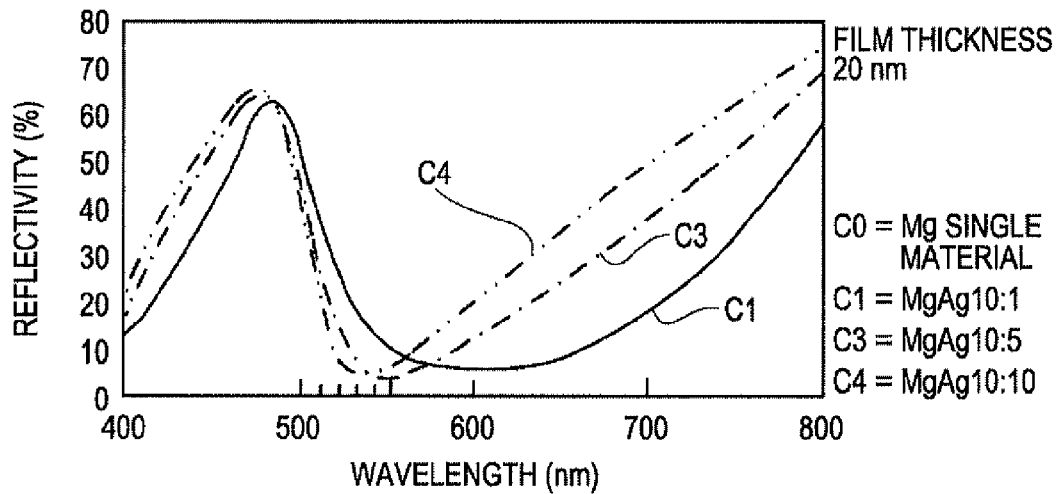
FIG. 12 is a graph showing a result of simulation of reflectivity for green light in the light emitting device in FIG. 1, when a composition ratio of the second electrode layer is set as a parameter.

FIG. 12 is a graph for explaining the same purpose as that of the lower graph in FIG. 3, the graphs in FIGS. 6 and 7. In this case, in FIG. 12, the composition ratio of the second electrode layer 22 is used as a parameter, instead of the film thicknesses T1, T2, and T3 used as the parameter in FIG. 6. That is, FIG. 12 shows a relationship between a variation in the above-described composition ratios C1, C3, and C4 and the reflectivity of the external light.

FIG. 12 shows a result described below on the following assumption:

(i) the meaning of the composition ratios C1, C3, and C4 in FIG. 12 is the same as that in FIG. 11;

(ii) the film thickness is 20 nm like in FIG. 11; and (iii) FIG. 12 shows simulation of the reflectivity for green light.

As shown in FIG. 12, the reflectivity decreases and increases at a uniform period with respect to a wavelength like the lower graph in FIG. 3. In addition, it can be known that the reflectivity near the peak wavelength of 550 nm for the green light decreases in either the composition ratio C1, C3, and C4. At this time, it can be confirmed that there is a difference in a shape of reflectivity reduction depending on a difference of the composition ratios C1, C3, and C4. That is, the weakest effect of reducing the reflectivity in the peak wavelength of 550 nm is shown in the composition ratio C1. In contrast, the effect is improved in the composition ratio C4, and the most excellent effect can be obtained in the composition ratio C3. However, the almost same effect is shown in the composition ratios C3 and C4.

The result implies that a more excellent effect of reducing the reflectivity can be obtained by varying the composition ratio. That is because the curve denoted by "C1" in FIG. 12 is the substantially same as the curve denoted by "T3" in the lower graph in FIG. 3. That is, both the cases are the reflectivity assuming that the second electrode layer 22 has the film thickness of 20 nm and the composition ratio of Mg:Ag=10:1. Accordingly, the curves C3 and C4 in FIG. 12 are all improved more than the curves T2 and T3 shown in the lower graph in FIG. 3 (notice that graduations of a vertical axis of the lower graph in FIG. 3 are different from those in FIG. 12).

From the above description, it can be concluded that it is possible to achieve the practical effect of reducing the reflectivity by allowing the refractive index in major wavelength areas to be 1 or more as long as the film thickness is sufficiently large even in a large composition ratio of Ag in the MgAg alloy.

Figure 13:
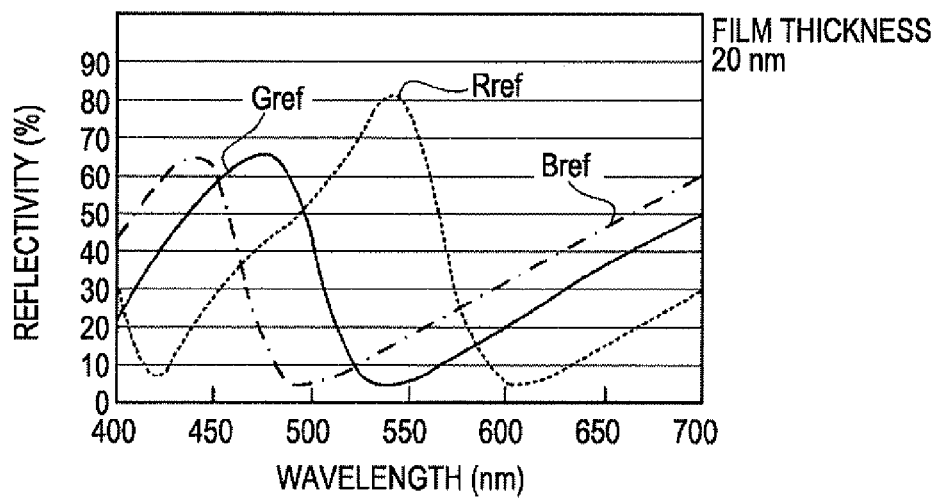
FIG. 13 is a graph showing simulation results of reflectivity for blue light and red light in addition to the result of the simulation for the green light in FIG. 12 together when the film thickness of the second electrode layer is 20 nm.

FIG. 13 shows the simulation result in FIG. 12 and the same simulation results (corresponding to the result in FIGS. 6 and 7) for the blue light and the red light (not shown) as that in FIG. 12 when the film thickness of the second electrode layer 22 is 20 nm (that is, C1 in FIG. 12). The reason for selecting the film thickness of 20 nm is to compare FIG. 14 described below and FIG. 9 described above on the basis of FIG. 13.

As shown in FIG. 13, a curve Gref has a very low reflectivity value near the peak wavelength of 550 nm, a curve Bref has a very low reflectivity value near the peak wavelength of 470 nm, and a curve Rref has a very low reflectivity value near the peak wavelength of 610 nm.

Figure 14:
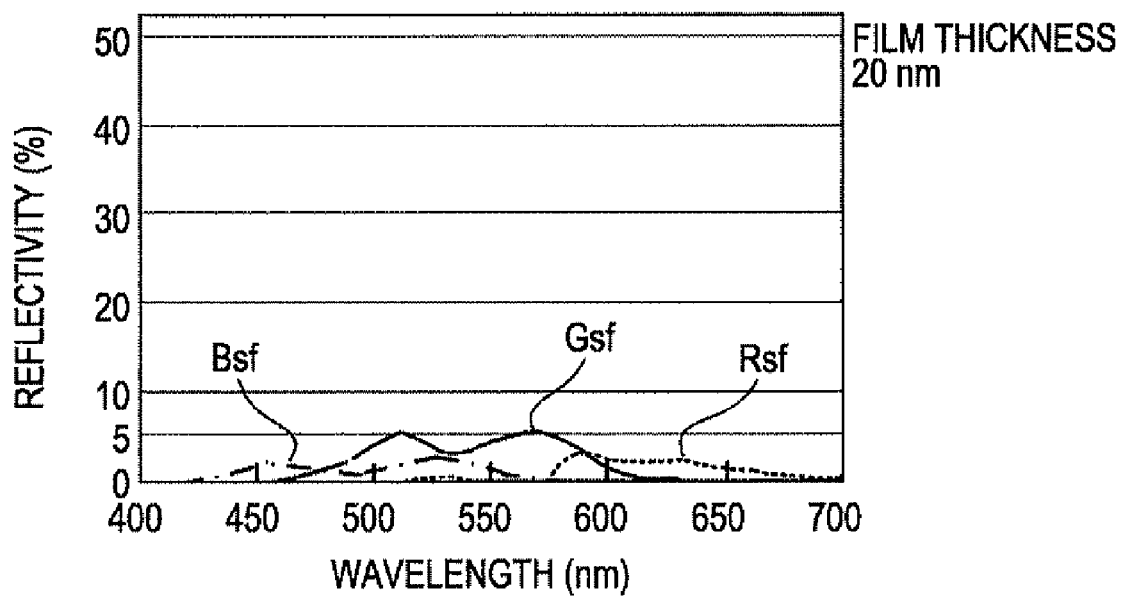
FIG. 14 is a graph showing the simulation result of the reflectivity as a visibility property obtained on the basis of FIG. 13.

From the result for the whole colors, as shown in FIG. 14, the reflectivity as a visibility property is very excellent since the visibility property is about 5% or less for any color. In addition to FIG. 14, the reduction in the reflectivity near the peak wavelengths of the respective colors reflects the result in FIG. 12 described above. Meanwhile, a reduction in the reflectivity in wavelength areas other than the peak wavelength areas reflects the absorption effect of the color filter 36. For example, since the color filter 36G absorbs light in the wavelength area other than the vicinity of the peak wavelength of 550 nm in a curve Gsf in FIG. 14, a reflectivity value is lowered (the same is applied to curves Bsf and Rsf). In addition, the meaning of "the reflectivity as the visibility property" described above is the same as that in FIG. 9 described above.

As shown in comparison between FIGS. 14 and 9, it can be known that the reflectivity as the visibility property in FIG. 14 is more improved. The improvement in the reflectivity is realized by the increase in the refractive index (see the comparison between the curve C1 in FIG. 10 and the curve C1 in FIG. 11). The conditions in FIGS. 14 and 9 are the same in the composition ratio of Mg:Ag=10:1, but are different since the film thickness in FIG. 14 is 20 nm and the film thickness in FIG. 9 is 12.5 nm. Accordingly, it can be at least concluded that a difference in both the results is shown because of the difference in the film thickness.

In this way, the organic EL device according to this embodiment can realize the effect of reducing the reflectivity more efficiently by allowing the refractive index of the second electrode layer 22 to be 1 or more and by appropriately adjusting the composition ratio of the alloy.

Figure 15:
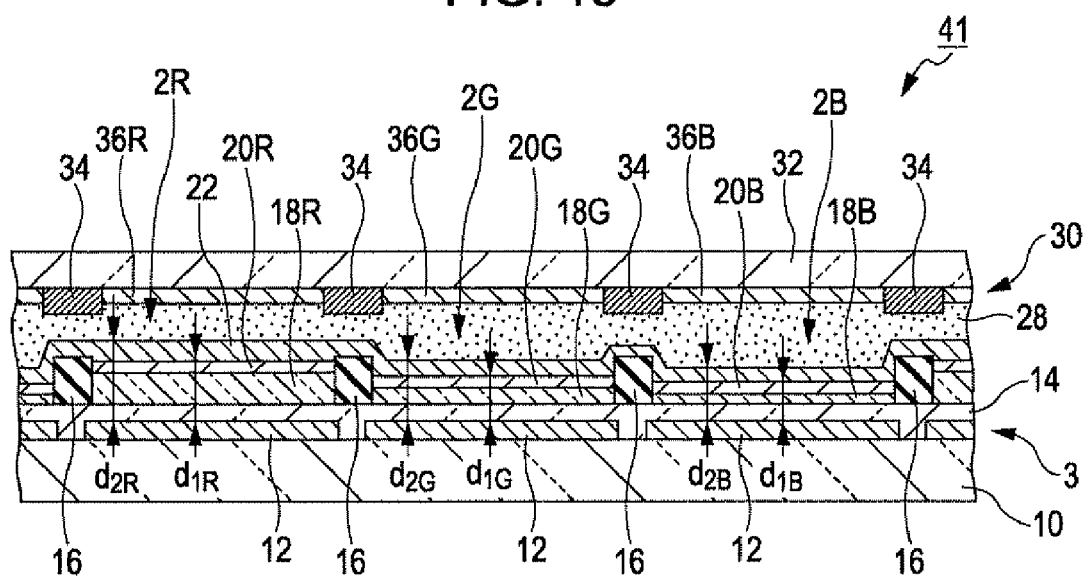
FIG. 15 is a sectional view illustrating an overall configuration of Modified Example (first Modified Example) of the light emitting device according to the embodiment of the invention.
Figure 16:
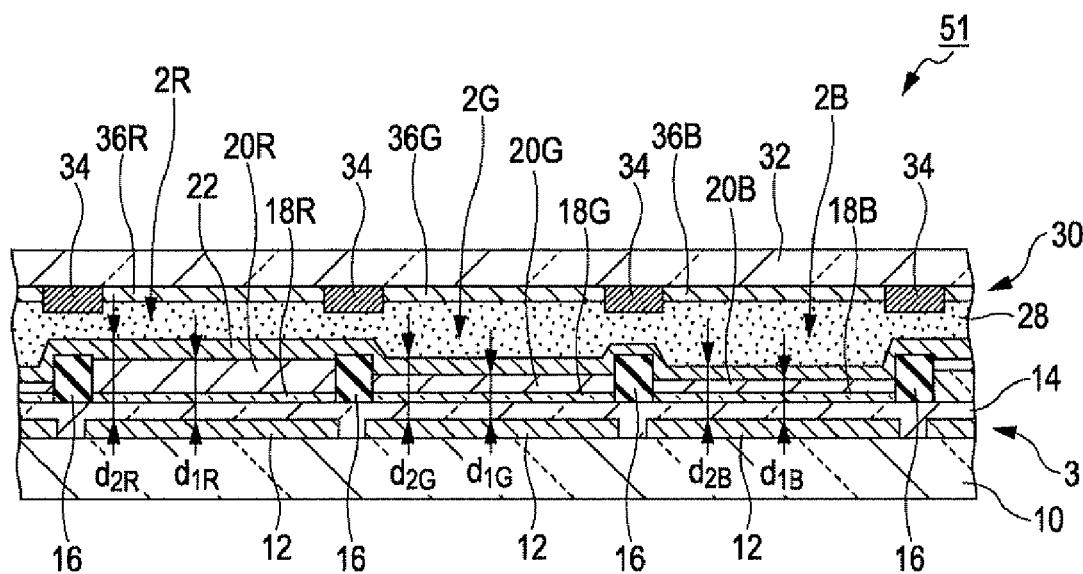
FIG. 16 is a sectional view illustrating an overall configuration of Modified Example (second Modified Example) of the light emitting device according to the embodiment of the invention.
Figure 17:
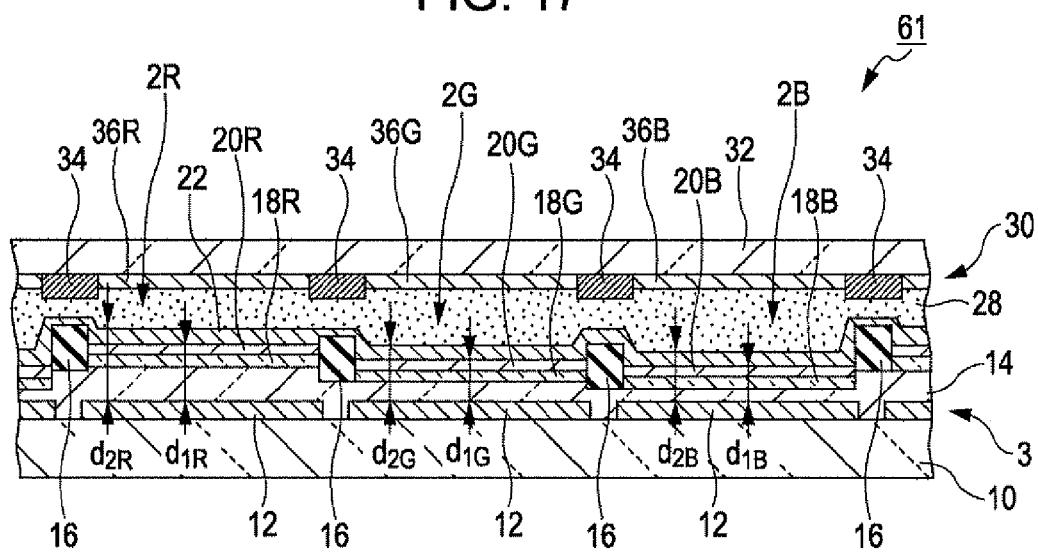
FIG. 17 is a sectional view illustrating an overall configuration of Modified Example (third Modified Example) of the light emitting device according to the embodiment of the invention.

The embodiment of the invention has been described. However, the light emitting device related to the invention can be modified in various forms without limiting the light emitting device to the above-described embodiment. For example, a first modified example of the light emitting device 41, a second modified example of the light emitting device 51 and a third modified example of the light emitting device 61 are shown in FIGS. 15-17.

(1) In the above-described embodiment, the first transparent electrode layer 18 is the anode and the second electrode layer 22 having translucent semi-reflection property is the cathode. However, the first electrode layer 18 may be the cathode and the second electrode layer 22 may be the anode.

(2) In the above-described embodiment, the first electrode layer 18 and the reflection layer 12 are separately formed, but the first electrode layer 18 and the reflection layer 12 may be formed in a single layer.

(3) In the above-described embodiment, the light emitting device is of the top emission type, but the light emitting device related to the invention may be of a bottom emission type. That is, the reflection layer may be disposed on a layer more far away from the substrate than the light emitting function layer.

(4) In the above-described embodiment, the light emitting device is the organic EL device. However, the light emitting device related to the invention may be an inorganic EL device.

(5) In the above-described embodiment, the light emitting function layer 20 emits white light. However, the invention is not limited thereto. For example, as shown in FIG. 15, the light emitting function layers 20R, 20G, and 20B are formed in the light emitting elements 2R, 2G, and 2B, respectively. The light emitting function layers 20R, 20G, and 20B are disposed in the pixel openings of the separators 16. The light emitting function layer 20R emits red light, the light emitting function layer 20G emits green light, and the light emitting function layer 20B emits blue light.

With such a configuration, the thickness of the first electrode layer 18 is different depending on the light emitting function layers 20R, 20G, and 20B. The reason is to satisfy the optical distance $d_2$ calculated from Formulas (4) to (6) and the optical distance $d_1$ calculated from Formulas (8) and (10) like the above-described embodiment.

(6) In the above-described embodiment, the adjustment of the thickness of an actual laminated structure is made by adjusting the thickness of the first electrode layer 18 in order to met the optical distances $d_1$ and $d_2$. However, the invention is not limited thereto.

For example, as shown in FIG. 16, the thicknesses of the light emitting function layers 20R, 20G, and 20B may be made different depending on the light emitting elements 2R, 2G, and 2B. Alternatively, as shown in FIG. 17, the thickness of the insulating transparent layer 14 may be made different depending on the light emitting elements 2R, 2G, and 2B.

APPLIED EXAMPLE

Figure 18:
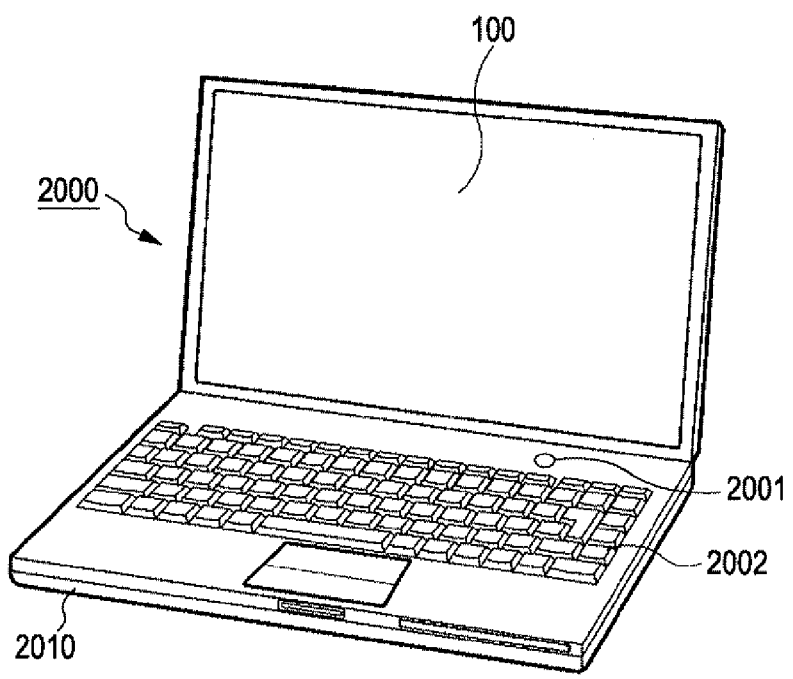
FIG. 18 is a perspective view illustrating an electronic apparatus to which the organic EL device related to the invention is applied.

Next, an electronic apparatus to which the organic EL device related to the invention is applied will be described. FIG. 18 is a perspective view illustrating a configuration of a mobile personal computer using the light emitting device according to this embodiment as an image display device. A personal computer 2000 includes an organic EL device 100 as a display device and a body unit 2010. The body unit 2010 includes a power supply switch 2001 and a keyboard 2002.

Figure 19:
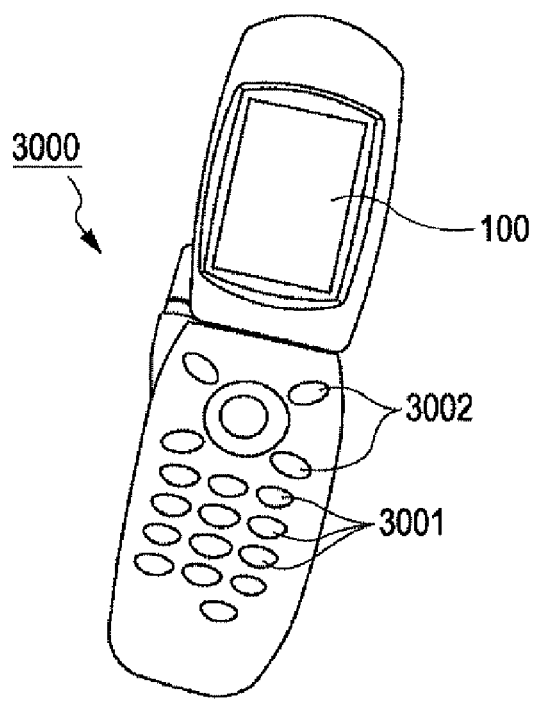
FIG. 19 is a perspective view illustrating another electronic apparatus to which the organic EL device related to the invention is applied.

FIG. 19 shows a cellular phone to which the light emitting device according to this embodiment is applied. A cellular phone 3000 includes a plurality of operational buttons 3001, scroll buttons 3002, and an organic EL device 100 as a display device. A screen displayed on the organic EL device 100 is scrolled by operation of the scroll buttons 3002.

Figure 20:
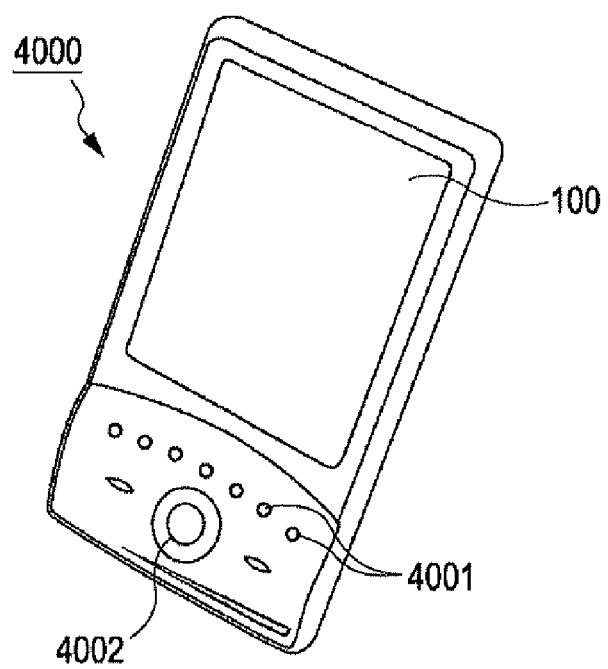
FIG. 20 is a perspective view illustrating other electronic apparatus to which the organic EL device related to the invention is applied.

FIG. 20 shows a PDA (Personal Digital Assistant) to which the light emitting device according to this embodiment is applied. The PDA 4000 includes a plurality of operational buttons 4001, a power supply switch 4002, and an organic EL device 100 as a display device. Various kinds of information such as an address book or a schedule book are displayed on the organic EL device 100 by operation of the power supply switch 4002.

In addition to the electronic apparatuses shown in FIGS. 18 to 20, examples of electronic apparatuses to which the organic EL device related to the invention includes a digital camera, a television, a video camera, a car navigation, a pager, an electronic pocket book, an electronic paper, a calculator, a word processor, a workstation, a television phone, a POS terminal, a video playback apparatus, and an apparatus having a touch panel.

The entire disclosure of Japanese Patent Application No. 2007-270990, filed Oct. 18, 2007 and Application No. 2008-221045, filed Aug. 29, 2008 are expressly incorporated by reference herein.

What is claimed is:

1. A light emitting device comprising:
a light emitting element which includes a first electrode layer, a translucent semi-reflection layer, and a light emitting function layer disposed between the first electrode and the translucent semi-reflection layer;
a reflection layer which reflects light emitted from the light emitting function layer toward the light emitting function layer;
the translucent semi-reflection layer, which is disposed opposite the reflection layer with the light emitting function layer interposed therebetween to reflect some of the light emitted from the light emitting function layer toward the light emitting function layer and to transmit the remainder of the light, the translucent semi-reflection layer having a refractive index of 1 or more;
a plurality of separators sandwiching the first electrode layer;
a color filter which is disposed opposite the light emitting function layer with the translucent semi-reflection layer interposed between the color filter and the light emitting function layer to transmit the light transmitted through the translucent semi-reflection layer,
wherein an optical distance between the reflection layer and an interface which is not opposite to the reflection layer in the translucent semi-reflection layer is determined on the basis of $d_1$ calculated from Formula (1):

$$d_2=(p+1/2)\cdot\lambda/2-(\phi_1-\phi_2)\cdot\lambda/4\pi \qquad (1),$$

where $\lambda$ is a wavelength corresponding to a peak of transmissivity of the color filter,
$\phi_1$ is a phase variation occurring when light having a wavelength $\lambda$ traveling from an opposite side of the light emitting function layer to the translucent semi-reflection layer reflects from an interface opposite the light emitting function layer of the translucent semi-reflection layer,
$\phi_2$ is a phase variation occurring when light having a wavelength $\lambda$ traveling from the light emitting function layer to the reflection layer reflects from the reflection layer, and
p is a positive integer.

2. The light emitting device according to claim 1, further comprising:
a color filter which is disposed opposite the light emitting function layer with the translucent semi-reflection layer interposed therebetween to transmit the light transmitted through the translucent semi-reflection layer,
wherein the translucent semi-reflection layer has a predetermined physical thickness $t_z$, and
wherein an optical distance between the reflection layer and an interface which is opposite to the reflection layer in the translucent semi-reflection layer is determined on the basis of $d_1$ calculated from Formula (2):

$$d_2=(p+1/2)\cdot\lambda/2-(\phi_1-\phi_2)\cdot\lambda/4\pi-n_z\cdot t_z \qquad (2),$$

where $\lambda$ is a wavelength corresponding to a peak of transmissivity of the color filter,
$\phi_1$ is a phase variation occurring when light having a wavelength $\lambda$ traveling from an opposite side of the light emitting function layer to the translucent semi-reflection layer reflects from an interface opposite the light emitting function layer of the translucent semi-reflection layer,
$\phi_2$ is a phase variation occurring when light having a wavelength $\lambda$ traveling from the light emitting function layer to the reflection layer reflects from the reflection layer,
p is a positive integer, and
$n_z$ is a refractive index for a wavelength $\lambda$ of the translucent semi-reflection layer.

3. The light emitting device according to claim 1,
wherein the translucent semi-reflection layer contains an alloy of at least two kinds of unit elements, and
wherein an alloy composition of the translucent semi-reflection layer is determined depending on a physical thickness of the translucent semi-reflection layer or the physical thickness of the translucent semi-reflection layer is determined depending on the alloy composition, when the refractive index varies depending on a variation in a composition ratio of one element of the unit elements and a variation in the physical thickness of the translucent semi-reflection layer.

4. The light emitting device according to claim 1, wherein the translucent semi-reflection layer contains MgAg.

5. An electronic apparatus comprising the light emitting device according to claim 1.

6. The light emitting device according to claim 1, further comprising:
a plurality of first electrode layers, wherein the plurality of separators are disposed between the plurality of first electrode layers.

* * * * *